United States Patent [19]

Shenoy et al.

[11] Patent Number: 4,583,078
[45] Date of Patent: Apr. 15, 1986

[54] SERIAL VITERBI DECODER

[75] Inventors: Ajit Shenoy, Silver Spring; Peter N. Johnson, Jr., Germantown, both of Md.

[73] Assignee: Communications Satellite Corporation, Washington, D.C.

[21] Appl. No.: 671,529

[22] Filed: Nov. 13, 1984

[51] Int. Cl.$^4$ .............................................. G08C 9/00
[52] U.S. Cl. ............................................ 340/347 DD
[58] Field of Search .................. 340/347 DD; 371/43

[56] References Cited

U.S. PATENT DOCUMENTS

| | | | |
|---|---|---|---|
| 3,662,338 | 5/1972 | Cain, III | 371/43 |
| 4,015,238 | 3/1977 | Davis | 371/43 |
| 4,462,101 | 7/1984 | Yasuda et al. | 371/43 |
| 4,477,912 | 10/1984 | Russell | 340/347 DD |

OTHER PUBLICATIONS

Viterbi, "Convolutional Codes and Their Performance in Communication Systems," IEEE Transactions on Comm. Tech., vol. COM-19, No. 5, Oct. 1971, pp. 751-772.

A. J. Viterbi, "Error Bounds for Convolutional Codes and an Asymptotically Optimum Decoding Algorithm," IEEE Transactions on Information Theory, vol. IT-13, No. 2, Apr. 1967, pp. 260-269.

Primary Examiner—William M. Shoop, Jr.
Assistant Examiner—Sharon D. Logan
Attorney, Agent, or Firm—Sughrue, Mion, Zinn, Macpeak and Seas

[57] ABSTRACT

A serial Viterbi decoder in which a single set of circuits is sequentially used for all the encoder states to calculate the maximum probability path, as measured against received signals, of unencoded signal sequences to reach each encoder state. The path to any encoder state having the maximum probability is traced back to output the oldest encoded signals.

9 Claims, 18 Drawing Figures

FIG. 12

SERIAL VITERBI DECODER

BACKGROUND OF THE INVENTION

The invention relates generally to encoding of digital data. In particular, the invention relates to a Viterbi convolutional decoder.

The transmission of digital data, particularly for large amounts of data over long distances, must contend with a noisy transmission path. A typical digital communication system is designed to operate at a maximum data rate and a minimum power level. These conflicting requirements usually mean that the system is operating relatively close to the noise level associated with the transmission path. As a result, a significant number of transmitted bits will be overwhelmed by the transmission path noise and will not be accurately received. That is, the bit error rate becomes unacceptably high.

Reducing the transmission rate or increasing the power levels would reduce the bit error rate. However, a more attractive alternative for many systems is to accept the high bit error rate but to provide error correction for the transmitted data. Error correction usually involves an encoder at the transmitting side of the communication path that transforms the data intended to be transmitted according to an error correction code and, necessarily, increases the number of bits to be transmitted. Then a decoder, situated at the receiving end of the transmission path, performs the inverse transformation to the one performed by the encoder. That is, the decoder operates upon the received bits and reproduces the original data. Most importantly, the decoder can use the additional information in the expanded data stream to correct bit errors up to a maximum number. The maximum number of bit errors that can be corrected depends upon the type of coding scheme used and, obviously, depends upon the extra number of transmitted bits. In the usual type of coding scheme, the transmitted bits cannot be divided neatly into data bits and correction bits because the encoder performs fairly complicated mathematical operations upon the entire data stream to produce an expanded data stream.

One type of error correction coding divides the data into regularly sized blocks which the encoder converts to a larger block. The decoder, upon receiving the encoded block, decodes it into its original form, presuming that the maximum number of bit errors has not been exceeded. Another technique, the one used in this invention, does not explicitly block the data but instead encodes or decodes the data a few bits at a time. However, the encoding and decoding depends in an indirect way on data that has already been coded. For this reason, this technique is called convolutional coding. Many types of convolutional decoders are well known. Cain, III in U.S. Pat. No. 3,662,338 discloses a threshold convolutional decoder and Forney, Jr. in U.S. Pat. No. 3,665,396 discloses a sequential convolutional decoder. Encoders for either block or convolutional codes are relatively straightforward, but decoding procedures are far more complicated because they must both perform the inverse transformation and tolerate errors. The development of practical decoding algorithms for convolutional codes has centered around probabilistic decoding algorithms on one hand and threshold or feedback decoding procedures on the other hand.

Probabilistic decoding algorithms are a type of error correction used to calculate the likelihood of the successful message transmission for all possible transmissions on the basis of reliability information extracted from present and past ensembles. The maximum probability then is the determining factor for judging what was transmitted. This approach usually involves the concept of a path of unencoded data. A possible path is defined by the sequence of unencoded data. A probabilistic decoding algorithm then calculates the probability of each path based upon both the currently received encoded data, possibly corrupted by noise, and prior receptions. At some point, the path with the highest probability is judged to be the correct path and therefore the unencoded data is determined. As a result, a memory of a suitable size for the various paths and an arithmetic capability for a message probability computation are required. Viterbi in a technical article entitled "Error Bounds for Convolutional Codes" and appearing in IEEE Transactions on Information Theory, IT-13, April 1967, at pp. 260-269, described a specific path decoding algorithm for convolutional codes which significantly reduces the number of computations needed to choose the most probable path. The theory of Viterbi decoding is well described in U.S. Pat. No. 4,015,238 to Davis and in U.S. Pat. No. 3,789,360 to Clark, Jr. et al. The Viterbi algorithm has been shown to be an efficient and practical decoding technique for short constraint length codes (to be explained later) and has been demonstrated to be a maximum-likelihood procedure.

FIG. 1 shows a relatively simple convolutional encoder in which unencoded information bits are input to a three stage shift register 20. One adder 22 receives the outputs of the three stages of the shift register 20, $b_2$, $b_1$ and $b_0$ while another adder 24 receives the outputs from only the first and last stage, $b_2$ and $b_0$. Both the adders 22 and 24 are modulo 2 adders so that their individual outputs are 0 or 1. At each clock period, an information bit is shifted into the shift register 20 and the bits already present are shifted toward the right. Also during each clock period, the two adders 22 and 24 output their separate code. It is of course seen that one bit of input data produces two bits of output data, that is, $n=1$ and $m=2$ for a rate n/m encoder. For this reason, the encoder of FIG. 1 is called a rate 1/2 encoder.

If it is assumed that the two initial bits $b_0$ and $b_1$ are both set to 0, then for the next input bit $b_3=0$, the code symbols (0,0) are output while if $b_2=1$, then (1,1) is output. In the next clock period, $b_3$ is shifted into the position of $b_2$, $b_1$ is substituted by $b_2$ and $b_0$ is substituted by $b_1$. In this further clock period, however, the output code depends not only upon the value of $b_3$ but also upon $b_2$. If $(b_3,b_2)=(0,0)$, then (O,O) is output in this clock period; if they equal (0,1), then (1,0) is output; if they equal (1,0), then (1,1) is output; and if they equal (1,1), then (0,1) is output. In the following clock period, the next input bit $b_4$ is shifted into the shift register with the remaining elements being shifted right. In this and following clock periods, the values of all three elements of the shift register 20 need to be considered in order to arrive at the correct output code symbols. However, no other input bits besides those three in the shift register 20 need to be considered. Accordingly, the encoder of FIG. 1 is said to have a constraint length of 3 or $k=3$.

FIG. 2 shows what is commonly known as a trellis for a convolutional encoder. The encircled numbers are the encoder states, that is the last two bits in the register 20, shown as $b_1$ and $b_0$ in FIG. 1. The paths from an encoder state are illustrated as solid when the next input bit, $b_2$ in FIG. 1, is a 0 and illustrated as dashed when the input bit is 1. Also shown enclosed in circles in FIG. 2 are the code symbols that are output from the adders 22 and 24, dependent not only upon the most recent input bit but also upon the state of the next two older bits. The initial encoder state at a depth of zero, as mentioned previously, is assumed to be (O,O), so that at the next depth of the trellis, there are two possible encoder states (0,0) and (1,0). At a trellis depth of 2, there are four possible encoder states, each reachable by only a single path for combinations of ($b_3$,$b_2$). What has been described to this point is simply a decisional tree. However, at a trellis depth of 3, there are again only four encoder states, each reachable by one of two paths. For instance, the encoder state (0,0) at trellis depth of 3 could be reached from an immediately prior encoder state of (0,0) with an input bit of 0 or from an encoder state of (0,1), also with an input bit of 0. The trellis pattern is repeated at each trellis depth greater than 3 for an encoder a constraint length of 3 encoder. The trellis diagram of FIG. 2 is important in convolutional decoders because it has been folded back to form a limited number of encoder states, four in FIG. 2, and the encoder states combined with the most recent input bit, constitute the total number of bits that need to be considered in the initial step of decoding.

The trellis diagram is used in decoding in the following manner. Only one path, defined by the sequence of input bits, is allowed to survive to any given encoder state at each trellis depth but there will be four surviving paths passing each trellis depth greater than the trellis depth of 2. When the next two-bit code symbol is received, the possible paths to the next trellis depth are used to generate tentative code symbols that can be compared with the received code symbol for the extension of the trellis to the new trellis depth. For each of the possible paths into one new encoder state, a probability is calculated as to whether that path had generated the current code symbol. Only the one path with the highest probability leading to that encoder state is allowed to survive. Thus it is seen that the surviving paths can cross, can branch and can become extinct, but always there are four surviving paths at each depth of the trellis.

Rather than calculate the probability that a particular path produced a particular sequence of received symbols, it is common to instead calculate the metric, which is a measure of the distance between the code symbols the path produced and the actually received code symbols. The minimum metric corresponds to the maximum probability. In the case where a hard decision is made on the received code symbols such that either one or the other of the two values of the bits in the code symbol is judged to have been received, then the metric is the number of differences between the received code symbols and the code symbols resulting from the path being evaluated. The advantage of using the metric is that, at each depth of the trellis, the metric is updated according to the most recently received symbols and it is not necessary to recompute the metric of the entire path.

In theory, the path histories for the entire transmission need to be maintained and only at the end of the transmission is the metric minimized to determine the path with the highest probability. This high probability path would then determine the entire transmission. However, in practice, once path histories for 4 or 5 constraint lengths have been calculated, it is highly likely that the oldest parts of the paths satisfactorily determine the input bits. This is explained by Viterbi in an article entitled "Convolutional Codes and Their Performance in Communication Systems", appearing in IEEE Transactions on Communication Technology, Vol. COM-19, No. 5, October 1971. Because of this fact, path histories are generally held in memory for only 4 or 5 constraint lengths and the oldest values are used as the result of the decoding.

It is seen that the decoder is very amenable to parallel design and processing since parallel paths through a multiplicity of encoder states must be calculated at each trellis depth. Parallel implementations are used by Davis and by Clark, Jr. et al in the previously cited patents. A parallel design appears to be implicit in the Viterbi decoders of Doland (U.S. Pat. No. 4,240,156) and Low et al (U.S. Pat. No. 3,697,950) who disclose the hardware for only one path. Obviously, parallel processing provides relatively high speed processors, perhaps with additional complexity due to the need for common metric and path memories. It must be borne in mind, however, that the rate 1/2 encoder, shown in FIG. 1, was presented for its ease of presentation. In fact, there are advantages to operating with longer constraint lengths. The number of encoder states, and thus the number of parallel processors in a parallel design, is $2^{k-n}$, that is, an exponential function of the constraint length less the information bits per input state. For the Viterbi decoders to be described with this invention, there are 64 encoder states. Such a decoder may be very fast but its complexity becomes a limiting factor. For low-cost, low-data rate commercial digital earth stations, for use with satellite communication systems, the complexity of the parallel processing for Viterbi decoding has meant that the decoder hardware has not been available. Ironically, it is precisely in these low-cost stations that the potential coding gain achievable in the Viterbi decoding is most needed. Attempts to reduce the complexity of the individual elements for the parallel processors have compromised the path memory and constraint lengths of the preferred code.

SUMMARY OF THE INVENTION

Accordingly, it is an object of this invention to provide a Viterbi decoder of low complexity and low cost.

It is another object of this invention to provide a Viterbi decoder, the size of which is not exponentially dependent upon the constraint length.

It is yet a further object of this invention to provide a Viterbi decoder that uses serial rather than parallel architecture.

The invention can be summarized as a Viterbi decoder having a high speed arithmetic processor that serially performs the state calculations for all encoder states and which uses the same memory for all the paths.

BRIEF DESCRIPTION OF THE DRAWINGS

FIG. 12 is a memory map of the path memory.

DETAILED DESCRIPTION OF THE PREFERRED EMBODIMENTS

Figure 1:
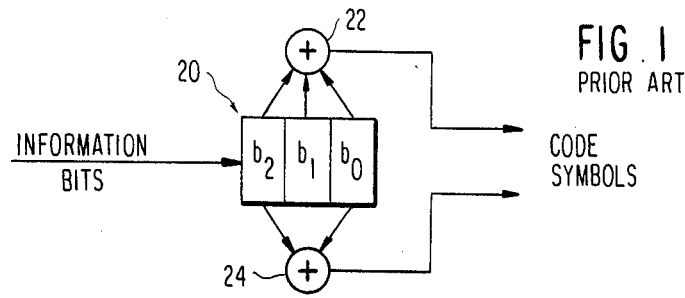
FIG. 1 is a schematic of a rate 1/2 convolutional encoder with constraint length of 3.
Figure 2:
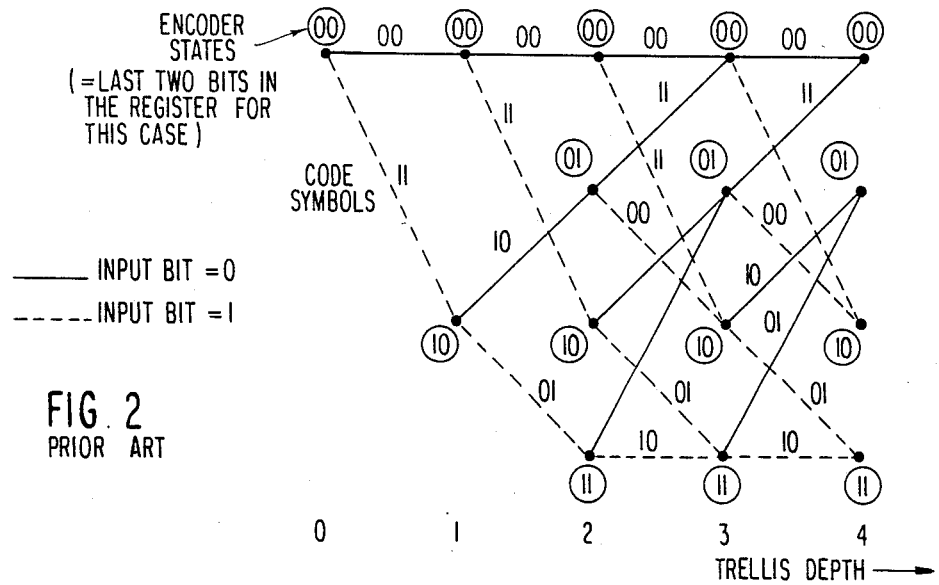
FIG. 2 is a trellis diagram for the convolutional decoder of FIG. 1.
Figure 3:
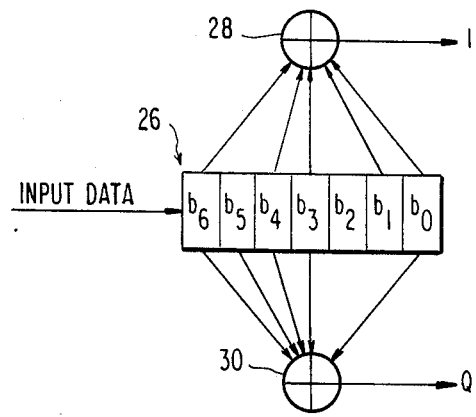
FIG. 3 is a schematic diagram of a rate 1/2 convolutional encoder with a constraint length of 7.
Figure 4:
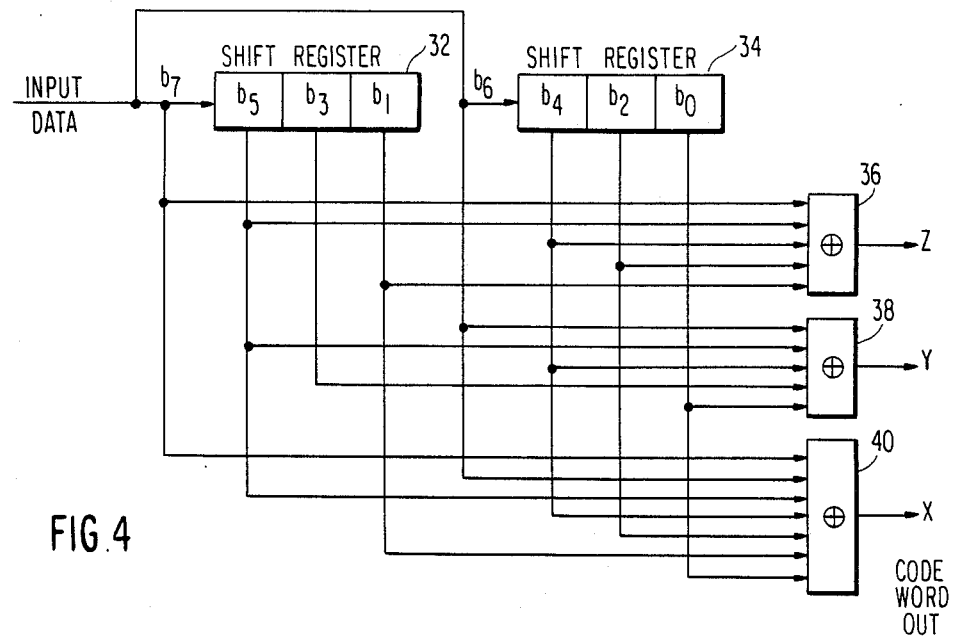
FIG. 4 is a schematic diagram of a rate 2/3 convolutional encoder with a constraint length of 8.

Two separate Viterbi decoders will be described, one for a rate 1/2 encoder with a constraint length of 7 and another for a rate 2/3 encoder with a constraint length of 8. However, the invention can be used with a general rate n/m decoder. The corresponding convolutional encoders are shown in FIGS. 3 and 4 respectively as examples only. The rate 1/2 encoder, shown in FIG. 3, comprises a 7 bit shift register 26 in which the input data is clocked in a bit at a time. One modulo 2 adder 28 receives the outputs from $b_0$, $b_1$, $b_3$, $b_4$ and $b_6$. Another modulo 2 adder 30 receives the outputs from $b_0$, $b_3$, $b_4$, $b_5$ and $b_6$. There are two output symbols I and Q for each input bit. The rate 2/3 encoder is shown in FIG. 4 and consists of two 3-bit shift registers 32 and 34 and three modulo 2 adders 36, 38 and 40 receiving the bits indicated in FIG. 4. The particular connections shown in FIGS. 3 and 4 define the convolutional code and will need to be considered in constructing the corresponding Viterbi decoders. The input data for the rate 2/3 encoder is shifted in 2 bits per clock period, with 1 bit being shifted into each of the shift registers 32 and 34. For each of the two input bits, three bits of an output symbol define the code word.

Figure 5:
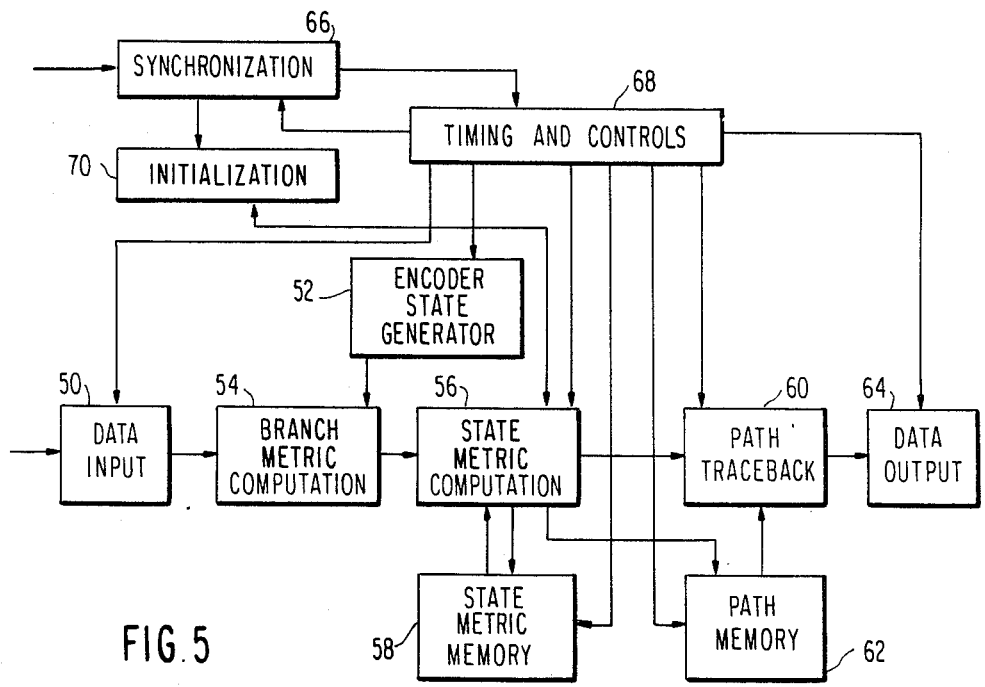
FIG. 5 is a general schematic diagram for the serial Viterbi decoder of this invention.

The general architecture for the serial Viterbi decoder of the present invention is shown in FIG. 5. The data is received in a data input section 50 which converts the received signal in each signal period to a signal state recognizable within the decoder. An encoder state generator 52 generates one of the 64 encoder states of both the rate 1/2 and the rate 2/3 decoder. The generator further generates the branches that lead to the encoder state, two in the case of the rate 1/2 decoder and four in the case of the rate 2/3 decoder. With the combination of the prior encoder state and the branch, the generator 52 then produces a digital signal indicative of which combination of code symbols would have been received for the particular combination of the branch and the encoder state. This generation of a replica of the transmitted signal must correspond to the encoding code used in the transmitter. This symbol is combined with the output of the data input section 50 in the branch metric computation unit 54 which calculates the distance between the actually received data and the predicted reception based upon the tentative path, defined by the branch and the generated encoder state.

This branch metric is then input to the state metric computation unit 56 which adds the branch metric to the state metric of the encoder state at the old end of the branch. This old state metric information is stored in a state metric memory 58. The state metric calculation is performed for each of the two branches (four branches for the rate 2/3 decoder) leading to the new encoder state. Then the branch and its associated prior path is selected which produces the minimum state metric. This new state metric is stored in the state metric memory 58 replacing the old value stored there for the particular encoder state. The branch having the minimum state metric to the new encoder state is stored in a path memory 62 for that encoder state. Once the path to an encoder state has been updated, based upon this previously described calculation, the encoder state generator generates the next of the 64 encoder states. The process is repeated until the next state metrics and the new paths have been calculated for all 64 states. Once all 64 path metrics have been calculated, the path having the minimum metric is chosen to define the oldest values of the paths stored in the path memory. A path traceback calculation unit 60 traces the path leading to the minimum metric encoder state back to its oldest entry based on path information in the path memory 62. This oldest information would be one bit for the rate 1/2 decoder and 2 bits for the rate 2/3 decoder. This data is output on a data output unit 64.

A synchronization unit 66 is required to maintain synchronization between the transmitted data and the timing of the decoder. The synchronization may be phase locked on the received data. The synchronization is triggered on a symbol-by-symbol basis on the recovered clock signal derived from a demodulator in the detector. A timing and control section 68 controls the operation of the decoder. An initialization unit 60 is required to initialize the state metrics and the path histories to zero values at the beginning of decoding for a message.

Figure 6:
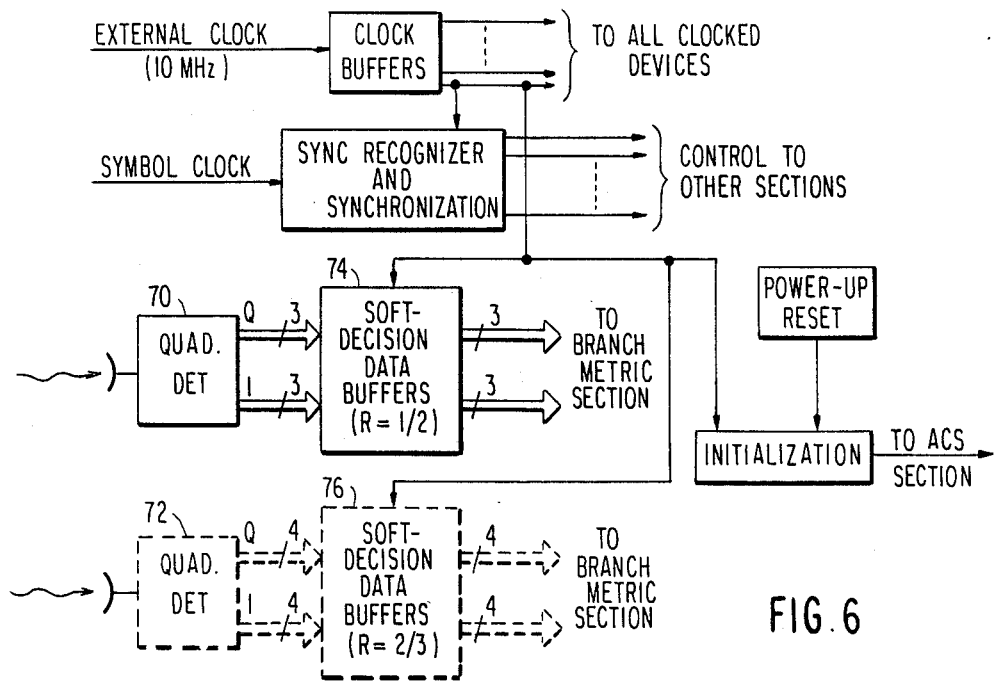
FIG. 6 is a block diagram illustrating the input section of the present invention.
Figure 7:
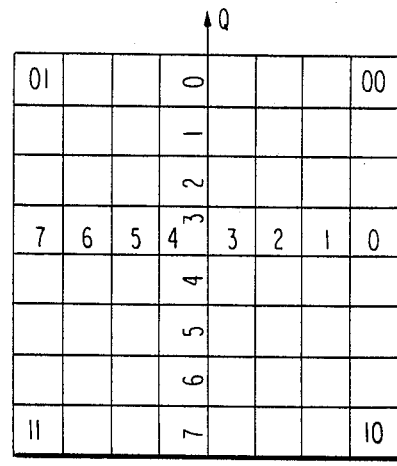
FIGS. 7 and 8 are signal state diagrams for the rate 1/2 and 2/3 decoders, respectively.
Figure 8:
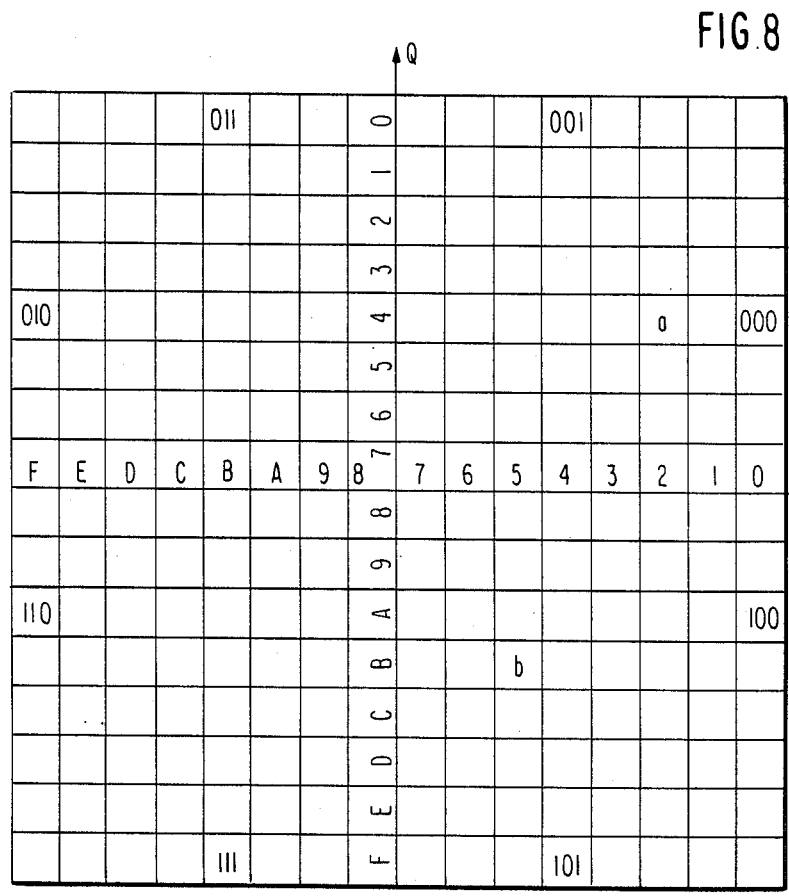

It is anticipated that the data is transmitted with M-ary phase shifted keying (MPSK). In M-ary phase shifted keying, the phase of a carrier wave is shifted to one of M values for each clock period of the transmitted carrier wave. Because the rate 1/2 encoder produces two bits for a code symbol in each clock period, there are four possible combinations of these symbols. Thus the rate 1/2 encoder requires quadrature phase shifted keying (QPSK). On the other hand, the three-bit code symbol output from the rate 2/3 encoder presents eight possible combinations so that octal phase shifted keying (OPSK) is required. At the receiving end, a quadrature detector detects the in-phase and out-of-phase components, I and Q, of the received wave for each clock period. The input section 50 for both a rate 1/2 and a rate 2/3 Viterbi decoder is shown in FIG. 6 in which the elements proper only to a rate 2/3 decoder are shown in dashed lines. A quadrature detector 70 for the rate 1/2 decoder has three-bit quantized outputs for both the I and the Q components while the corresponding detector 52 for the rate 2/3 decoder has four-bit quantized outputs. Other quantization levels are possible. The signal map for the rate 1/2 decoder is shown in FIG. 7 in which the signals corresponding exactly to the transmitted code signals are shown in the four corners. However, the signal diagram, quantized to three bits in both dimensions, allows for signals other than those precisely defined by the code symbols. The corresponding signal map for the rate 2/3 decoder is shown in FIG. 8 with the eight possible combinations of the transmitted code symbols illustrated in their respective signal locations. If a hard decision were to be made, then the signal locations associated with the received I and Q components would immediately be associated with the nearest allowed code symbol. For instance, in FIG. 8, if the signal a were received in a low noise background, it is fairly certain that a corresponds to the code symbol (000). However, in a noisy environment, the code symbol (000) may be corrupted to the signal location b because of such a noisy environment. In the present embodiment, the hard decision is not made but the fully quantized received signal is processed by the Viterbi decoder, that is, only a soft decision is made as to which of the 64 signal locations in the rate 1/2 decoder and which of the 256 signal locations for the rate 2/3 decoder does the received signal correspond. The 6 or 8 bits of signal location information are buffered in a data buffer 74 or 76. If an over-range capability were desired, the allowed symbols can be moved inward from the outside edges of FIGS. 7 and 8.

The branch metric is the distance between the received signal location and the code symbol that is proper for that branch. In actual practice, the square of the distance between the two signal states is calculated rather than the distance in order to make the metric values less susceptible to changes in the signal-to-noise ratio. This metric calculation can simply use the quantized numbers for judging what was transmitted. Other metrics, such as those based on log-likelihood or correlation product, can instead be used.

For the rate 2/3 decoder, the largest square distance or metric as seen in FIG. 8 is 346, which requires nine bits for binary representation. All distances are therefore scaled down to a smaller number so that a maximum square distance does not exceed a 5 bit representation, that is $31_{10}$. Similarly, the largest metric for the rate 1/2 decoder is seen from FIG. 7 to be a squared distance of 98, requiring 7 bits. Here the distances are scaled down so that the maximum metric of $51_{10}$ does not exceed a 6 bit representation. A value of 51 was chosen because it results in a maximum possible value of 255 at the state metric adder output, to be described later, which thus utilizes the full range of 8-bit arithmetic. This scaling implies a loss in distance resolution but does not cause any significant degradation in performance. The metrics are still representative of the actual distances although the metrics corresponding to neighboring signal locations are all zeros because of the decreased distance resolution.

Figure 9:
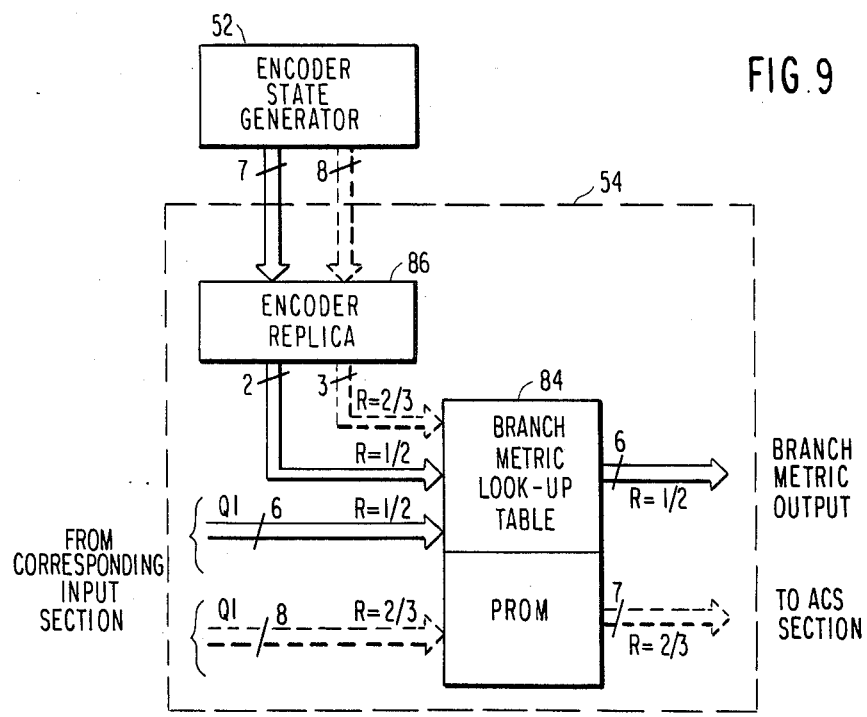
FIG. 9 is a block diagram illustrating the branch metric look-up section.

The distances from all the signal locations from each of the allowed code symbols, as represented in either FIG. 7 or 8, are programmed into a branch metric look-up table which is implemented in a programmable read-only memory (PROM) 84 located in the branch metric computation unit 54, as illustrated in FIG. 9. The PROM must be 256×6 for the rate 1/2 decoder and 2K×7 for the rate 2/3 decoder.

Figure 10:
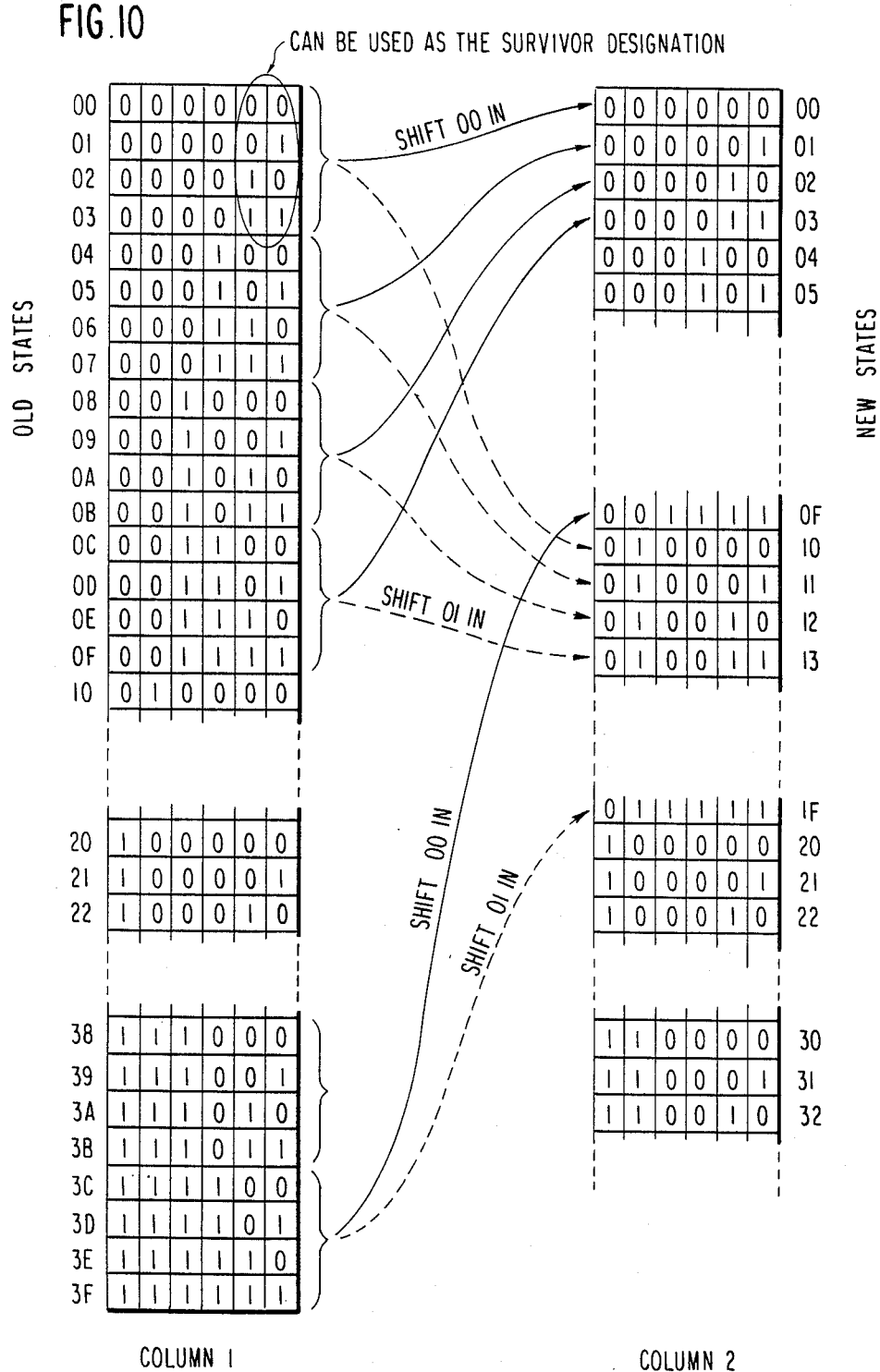
FIG. 10 is an illustration for the organization of the branches linking the old and new encoder states in a rate 2/3 decoder.

The encoder state generator 52 sequentially produces every combination of the encoder state and branch. Sixty-four encoder states are arranged, as illustrated in FIG. 10 for the rate 2/3 decoder, so that the state designator corresponds to the input bits which produce that state. Then the encoder state generator 52 can be a counter. The lowest bits of the output of the encoder state generator 52 then correspond to the input bits producing the branch. Note that only two of the four branches are illustrated in FIG. 10. Outputs of the encoder state generator 52 are led to an encoder replica circuit 86 that duplicates the operation of the encoders illustrated in FIGS. 3 and 4. Because the input bits are simultaneously available, the encoder replica circuit 86 could be implemented in a PROM. In fact, it is implemented as a shift register and associated gates or programmable array logic, just as is the encoder. The outputs of the encoder replica 86 designate the allowed code symbol combinations illustrated in FIGS. 7 and 8. For every set of data latched in the soft-decision data buffers 74 and 76, the encoder replica circuit 86 outputs one of four values for the rate 1/2 decoder and one of eight values for the rate 2/3 decoders.

Figure 11:
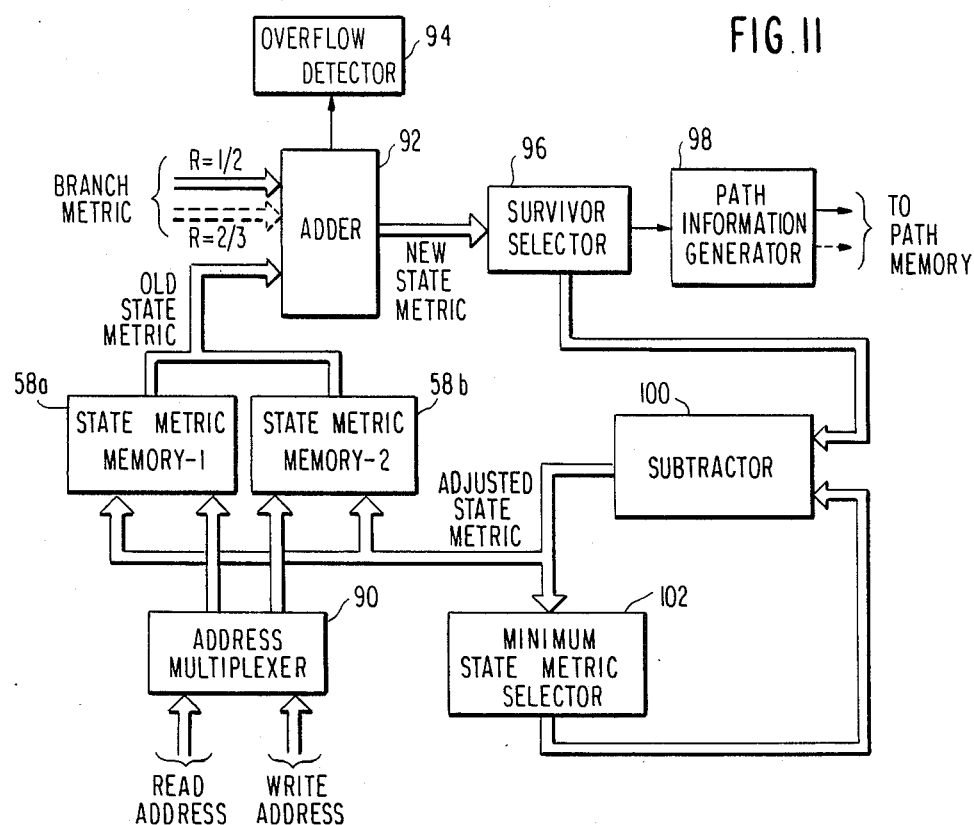
FIG. 11 is a block diagram of the add-compare-select circuit.

The selection of the survivor path is made in add-compare-select (ACS) arithmetic circuit illustrated in FIG. 11. The function of the ACS section is to compute the new state metrics for all possible paths based upon branch metrics and to select the one path leading to the new encoder state having the lowest state metric. The state metrics for all encoder states are stored in two state metric memories 58a and 58b. The duplication of the state metric memories 58a and 58b can best be understood by referring again to FIG. 10 which shows the possible branches between the old encoder states on the left and the new encoder states on the right. If each of the locations, labeled by the identification of the encoder states, contains the value of the state metric, then the state metric of the old state is added to the branch metric, linking the old state to the new state, to produce the possible new state metric on the right. For the rate 2/3 decoder, there are four branches leading to each of the new states, each coming from a different old encoder state. The 4 possible new state metrics are compared and the state metric having the minimum value is selected. When the compared metrics have identical values, which is chosen is immaterial. In fact, the lowest numbered one is taken. The path associated with the minimum state metric is designated as the survivor path. Once all the new state metrics and associated paths have been selected, the decoding process continues for the next period of received data. Once of the state metric memories 58a and 58b is associated with the column on the left and one with the column on the right. Rather than transferring the contents of the new state metric memory to the old state metric memory upon beginning a new decoding step, the two memories alternate in their functions of old and new state metric memories, that is, in one decoding period one of the memories 58a and 58b is being read from and the other being written into and, in the next decoding period, they perform the opposite function. There is thus no need to explicitly erase the contents of the state metric memories 58a and 58b since they will necessarily be overwritten in a subsequent step. A read address designates the old encoder state and a write address designates the new encoder state. A multiplexer 90 switches one of the read and write addresses when concurrently used to the correct state metric memory 58a or 58b. The old state metric is read from one of the memories 58a or 58b into an adder 92 which adds that value to the branch metric being output from the branch metric look-up table 84 to produce the possible new state metric. An overflow detector 94 detects if the results of the addition of the branch metric and state metric results in an overflow. An active overflow detector 94 indicates to the operator that the branch metric look up table 84 has been programmed with excessively large metrics.

The output of the adder 92 is led to a survivor selector 96 which compares the possible new state metrics leading to each new encoder state. For the 4 possible paths in a rate 2/3 decoder, the survivor selector 96 selects the path having the smallest new state metric. As can be seen from FIG. 10, the oldest two bits to the right of the old encoder state column indicate which of the branches to the new encoder state is the survivor. These two bits of the survivor are input to a path information generator 98 for storage in the path memory. The surviving state metric is input to a subtractor 100 in which it is decreased by the value of the minimum state metric of the previous decoding period. This prior minimum state metric is selected and stored in a minimum state metric selector that receives all state metrics for one decoding period, selects the minimum value and outputs this minimum value for the next decoding step. The subtraction of the minimum state metric prevents the adder 92 from overflowing and thus producing invalid outputs. The adjusted state metric output by the subtractor 100 is then stored in the state memory 58a or 58b that is designated as the new state metric memory.

Figure 12:
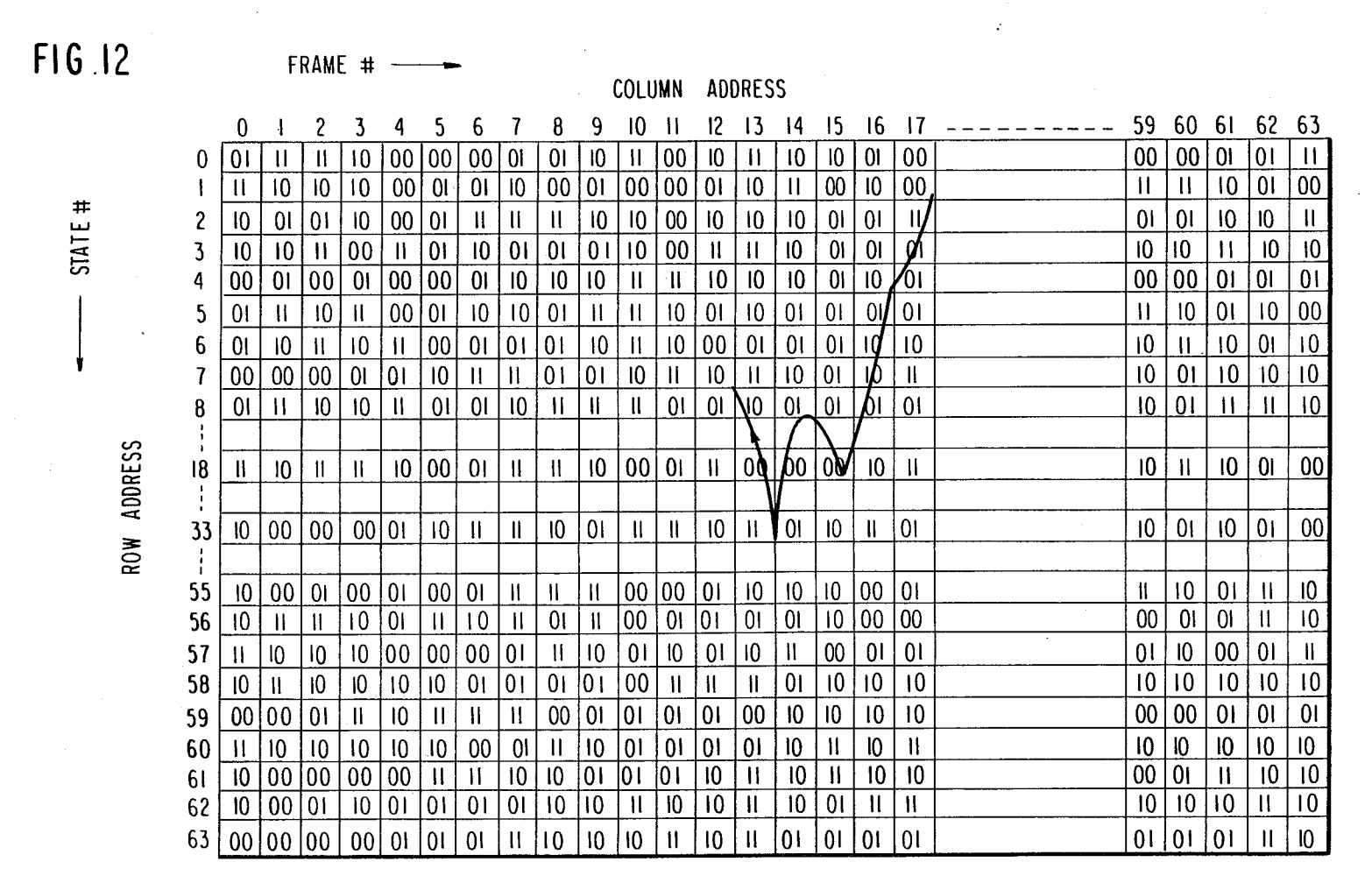

The organization of the path memory is illustrated in FIG. 12. The row address corresponds to the encoder state designation, in particular, the designation of the new encoder state during a decoding period. The column address corresponds to a frame number which increments once per decoding period and wraps around from frame number 63 to frame number zero. The contents of each location is the survivor designation for that new encoder state in that frame. That is, the oldest two bits of the old encoder state that provided the minimum value metric to the new encoder state is stored. The survivor designation provides sufficient information for the trace back operation to be described later.

Figure 13:
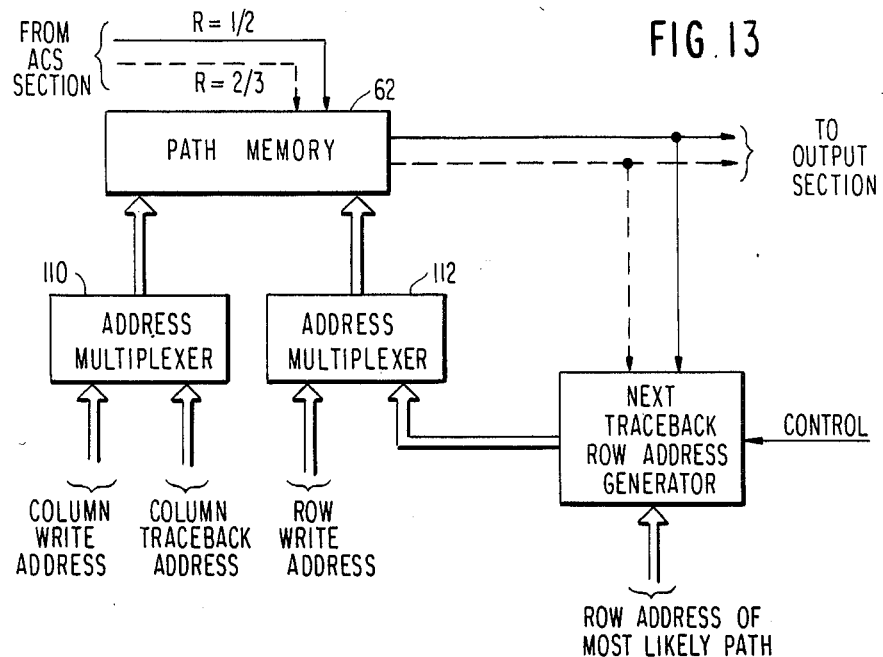
FIG. 13 is a block diagram of the path memory and traceback circuit.

The path memory and trace back system is illustrated in FIG. 13 in which the survivor designation is input from the ACS section to the path memory 62. In the storage of the survivor designation, a frame is set to a column write address which is selected by a column address multiplexer 110 which addresses the columns of the path memory 62. In the storage, the row of the path memory 62 is designated by a row write address routed to the memory 62 through row address multiplexer 112. The column write address is the frame number and the row write address is the new encoder state designator.

Figure 14:
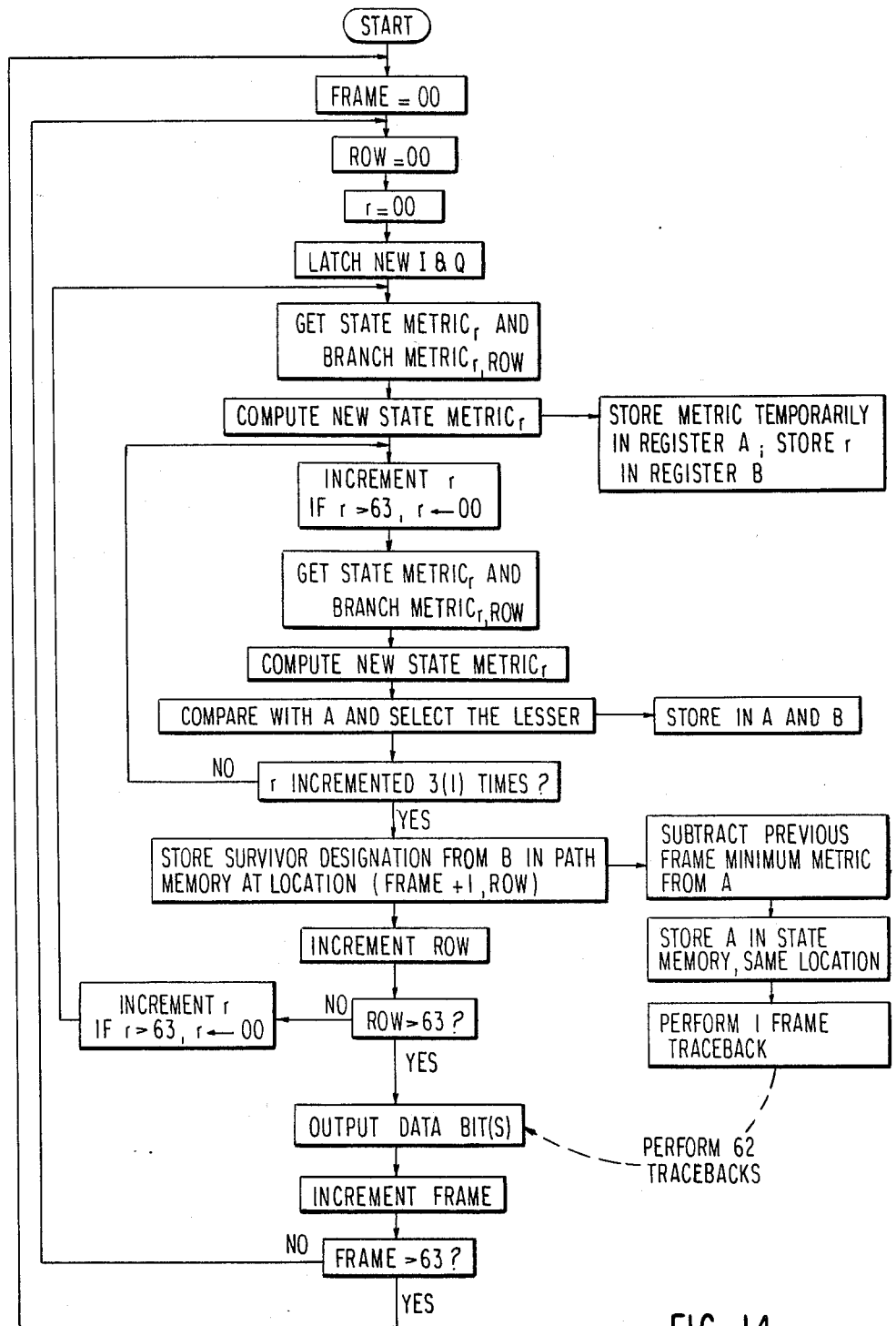
FIG. 14 is a flow diagram illustrating the operation of the invention.

The operation of the ACS section will now be described with reference to the flow diagram of FIG. 14. After start, the frame number ROW and index r are set to 0. The frame number relates to the decoding period. The ROW number corresponds to the new encoder state and also addresses the rows of the path memory 62. The index r corresponds to the designation of the old encoder state and equals the lowest six bits of the encoder state generator 52. Then new values of I and Q are latched. These values represent the received data in one decoding period. Then the old state metric designated by the index r is taken from the state metric memory 58A or 58B which is the current old state metric memory. Also, the branch metrix is obtained by inputting the index r and the highest two bits of the row address from the encoder state generator 52 through the encoder replica circuit 86 to the branch metric look-up table 84. The remaining address inputs to the table 84 are controlled by the quantized values of the latched I and Q. The output of the table 84 is the metric for this branch. A new state metric indexed by r is then calculated by adding in the adder 92 the old state metric and the branch metric. This value is temporarily stored in register A and represents the state metric for one of the four possible paths (in the rate 2/3 decoder) leading to the new encoder state. The current index r is stored in another register B to indicate to which state the metric belongs. Then the index r is incremented by 1. If, as a result, the index r has a value greater than 63, the index r is set to 0. It should be noted, at this time, that during one decoding period, the old encoder states represented by r are processed sequentially four different times while the new encoder states represented by the ROW address are processed only once. Then based upon the incremented value of r, the old state metric and the branch metrics, based upon the index r, are obtained and a possible new state metric is the sum of the two.

The possible new state metric is then compared with the value of A and the lesser of the two is stored back in A, that is, the lesser state metric is selected. If the register A is replaced, then the register B is updated with the current value of r. A test is then made as to whether r has been incremented three times for the rate 2/3 decoder (or one time for the rate 1/2 decoder), indicating that all four (or two paths) into the new encoder state have been evaluated. If not, the flow returns to increment the value of r to obtain another old encoder state.

If all paths into a new encoder state have been evaluated, then the register b designates the survivor with the minimum state metric which has been determined by the minimization of A. The survivor designation of the register B is stored in the path memory 62 at the location (FRAME+1, ROW). The designation of the path which is stored at this location is the lowest order two bits of r for the rate 2/3 decoder (lowest order bit for rate 1/2 decoder) that produce the minimum value of A. The minimum state metric of the preceding frame is subtracted from the value of A which is stored in the new state metric memory 58A or 58B. Then the ROW is incremented to indicate the processing of a further new encoder state. ROW is compared to the value 63 and if less than or equal to 63, r is incremented in modulo 64 and processing continues for a further new encoder state. If ROW is greater than 63, then all new encoder states have been processed and this decoding period is completed.

The one or two data bits to be output for the current frame or period are then determined by the following procedure. The designation r of the encoder state with the minimum state metric for the frame is used in the trace back of the path memory 62. As illustrated in FIG. 12, the trace-back is performed frame by frame, beginning at the most current complete frame. The next traceback ROW address is found by shifting the present bits of the path memory 62 pointed to by the ROW address 112 into the lower bit(s) of the ROW address generator 114. The number of bits shifted in are two for the rate 2/3 decoder and one for the rate 1/2 decoder. For instance, as illustrated in FIG. 12, if the trace-back begins in Frame 17 and the minimum state metric belongs to encoder state 1 that has a survivor designation of 0, indicating the branch to that encoder state, then the next prior encoder state in the path is encoder state 4. The process is repeated a total of 62 times to work back to the oldest survivor designation in the minimum metric path. The contents of this location are the oldest bits in the path which are then output. The FRAME is then incremented in modulo 64 addition and control returns to the frame or decoding period.

Although the trace-back could be performed between frames, in fact, the trace-back for one frame is performed concurrently with the updating of the next frame. For each of 62 of the 64 values of ROW, one step of the trace-back is performed. Thus, at the end of a frame update, the output data is ready from the previous frame.

What has been described is a strictly serial implementation. Another embodiment, particularly suitable for the rate 1/2 decoder, provides two parallel add-compare-select sections. These two sections each sequentially operate on the 64 old encoder states. However, one section processes the branches to the upper 32 new encoder states while the other section process the branches to the lower 32 new encoder states. As a result, it is not necessary to twice sequence the old encoder states.

Figure 15:
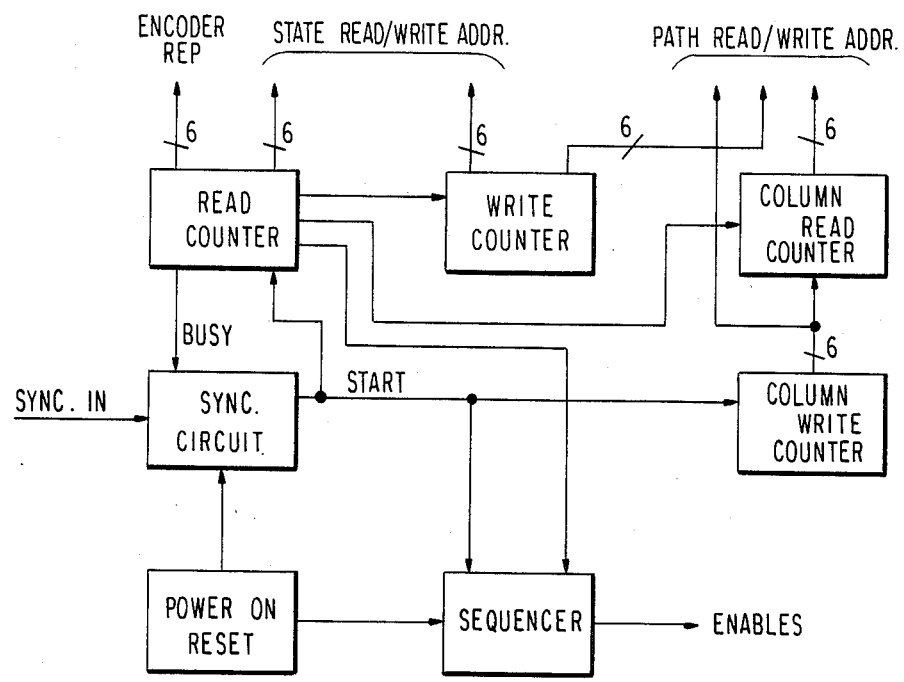
FIGS. 15 and 16 are circuit diagrams of the control circuitry for a rate 1/2 decoder and rate 2/3 decoder, respectively.
Figure 16:
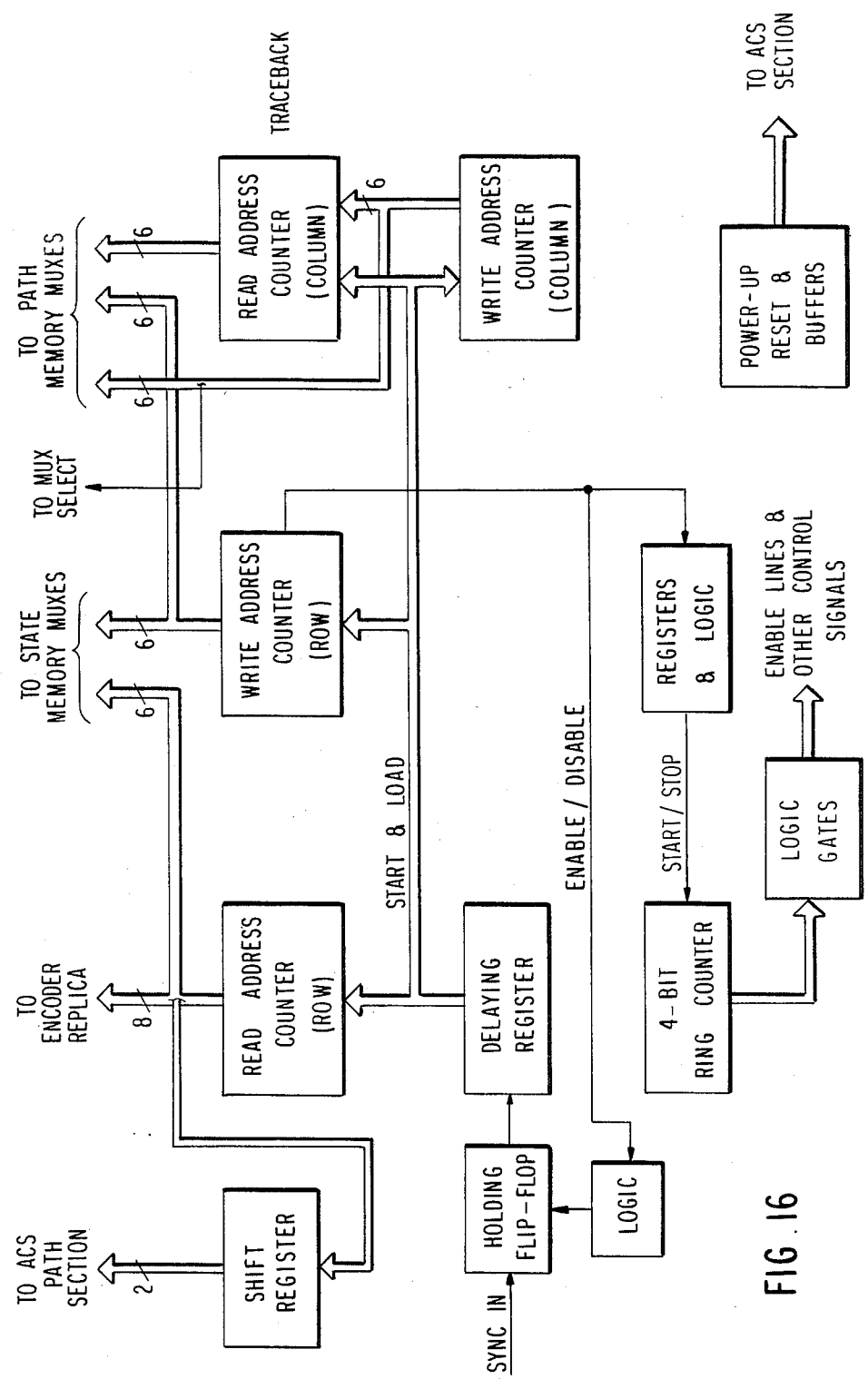
Figure 17:
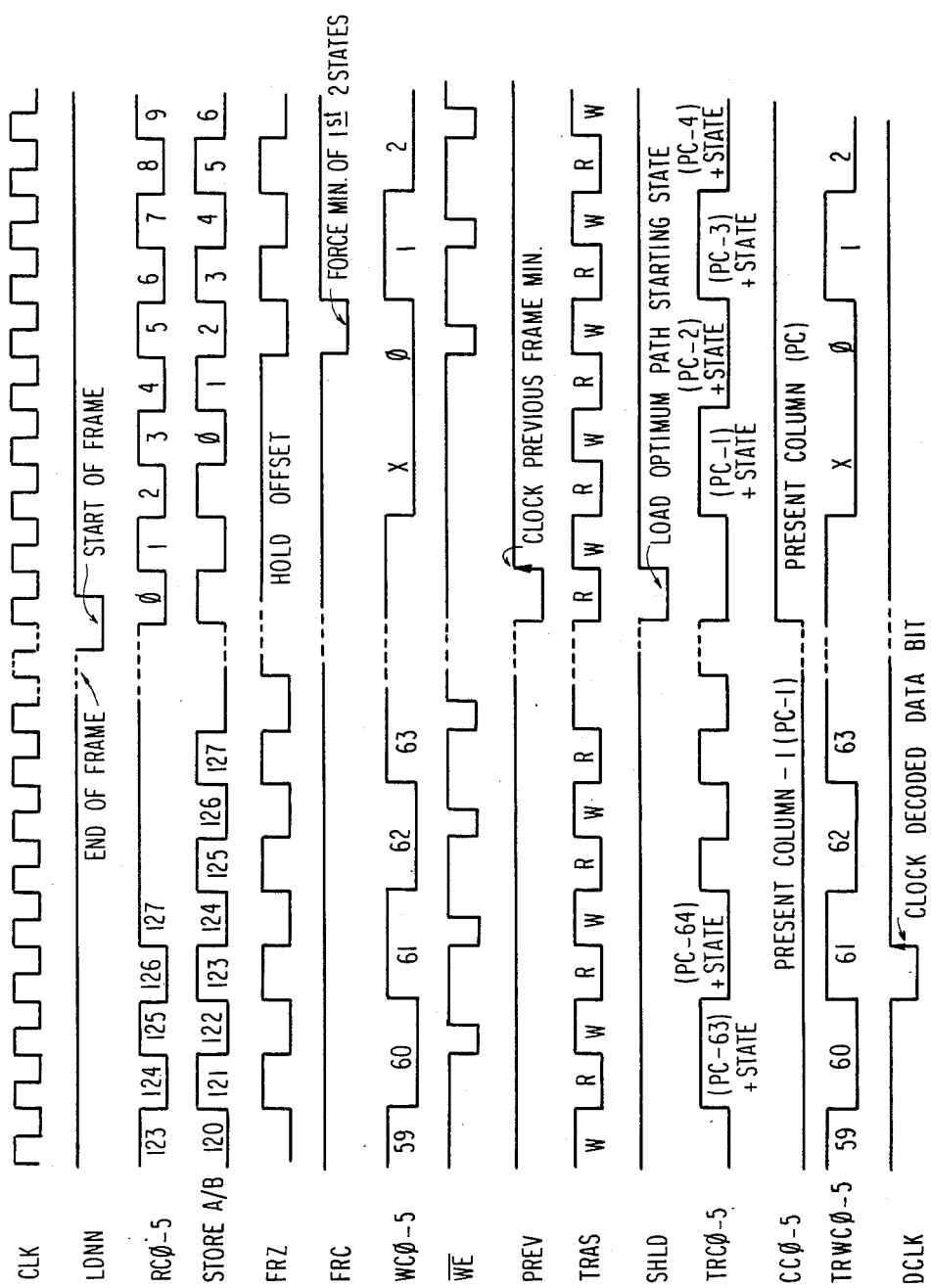
FIGS. 17 and 18 are timing diagrams for the control signals for a rate 1/2 decoder and rate 2/3 decoder, respectively.
Figure 18:
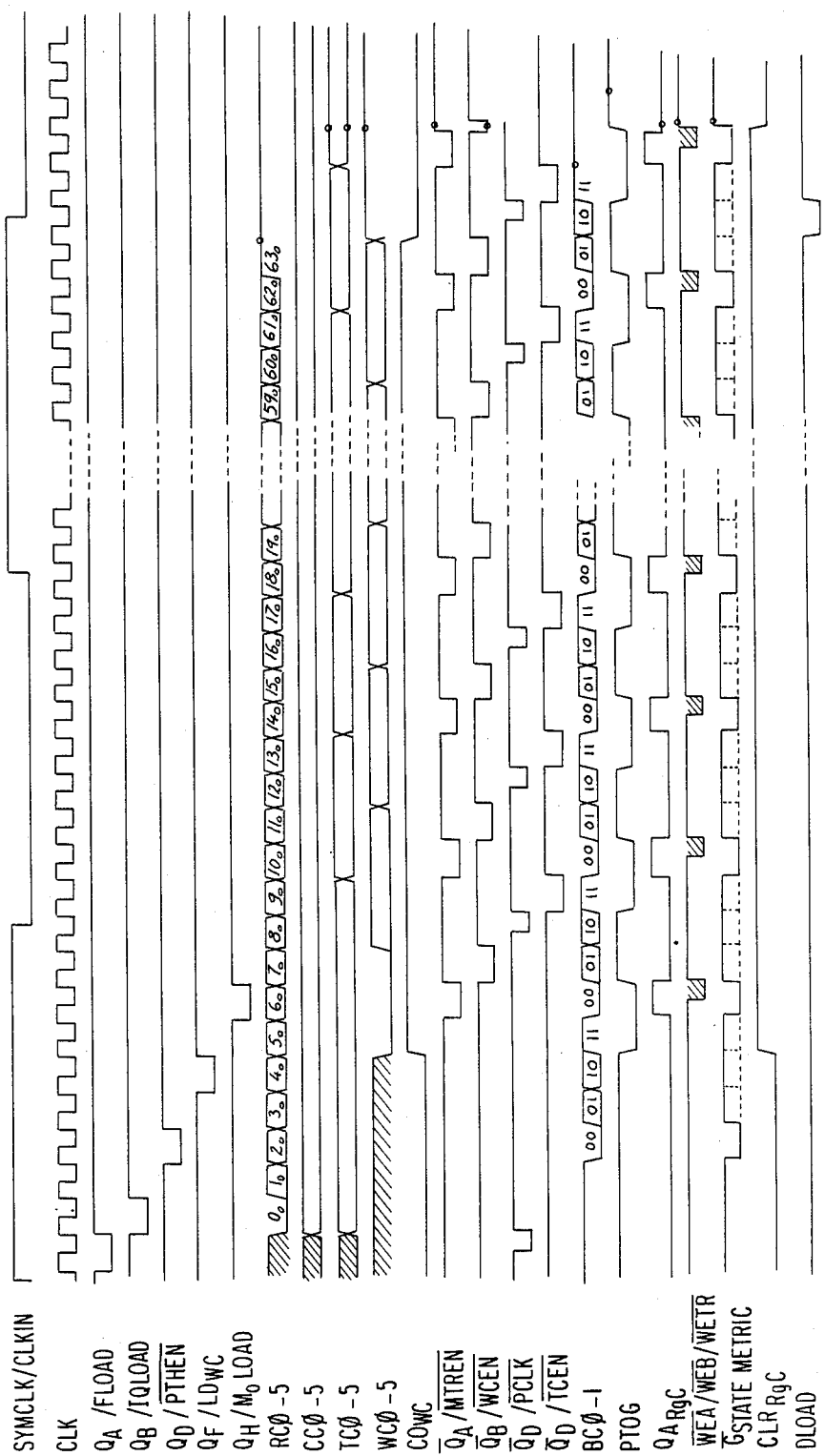

The timing and control 64 necessary for the operation of the decoder are shown in FIG. 15 for the rate 1/2 decoder and for the rate 2/3 decoder in FIG. 16. The signals at the timing and control 68 are presented in Table 1 for the rate 1/2 decoder and in Table 2 for the rate 2/3 decoder. The timing diagrams for the control signals are shown in FIG. 17 for the rate 1/2 decoder and in FIG. 18 for the rate 2/3 decoder.

TABLE 1
RATE-1/2 DECODER CONTROL SIGNALS

| Signal | Description |
|---|---|
| LDNN | This loads in the new symbol at the start of each frame. |
| RC0-5 | Six address lines from the read counter, producing the index r, that are used for the encoder replica and the state metric RAMs. |
| STORE A/B | Temporarily stores state metric in register A to be compared to the next one. Also stores register B. |
| FRZ | This signal preserves data at the minimum state metric selector until the previous minimum state metric is clocked to the subtractor input. |
| FRC | Forces the survivor metric of the first two states into the minimum state metric selector at the start of a frame. |
| WC0-5 | Six address lines from the write (ROW) counter used to indicate the write address for the state and path memories. |
| $\overline{WE}$ | Write enables for the state metric RAMs and the path memory. |
| PREV | This clocks out the previous frame minimum state metric to be used for subtraction in the state metrics of the present frame. |
| TRAS | Path memory address selector to a multiplexer which selects a read or write address. Toggles at the beginning of every read count. |
| SHLD | Loads the optimum starting address for the path traceback, that is, encoder state with minimum state metric in previous frame. |
| TRC0-5 | Six address lines from the traceback counter. Down counter is decremented every time a path information bit is read out. |
| CC0-5 | Six address lines from the column counter used to indicate the column address for the path memory. Incremented once every frame. |
| TRWC0-5 | Address lines from the write counter used to indicate the write address (ROW) for the state and path memories. Same as WC0-5. |
| DCLK | Clocks out the decoded data bit at |

TABLE 1-continued
RATE-1/2 DECODER CONTROL SIGNALS the end of frame.

TABLE 2
RATE-2/3 DECODER CONTROL SIGNALS

| Signal | Description |
|---|---|
| FLOAD | Load signal derived from the sync signal. This loads the minimum frame metric, resets the read counter, increments the column counter, loads the traceback counter, and loads the row location of the previous frame minimum metric. |
| IQLOAD | Loads the new I and Q coordinates. |
| PTHEN | Path enable signal. Loads 00 in the path buffer, which corresponds to the first survivor designation of the first member in a group of four in the present column. |
| LD | Resets the write counter and starts the ring counter. Most processes occur in multiples of four for rate 2/3 decoder. A ring counter counts out the four cycles. |
| M$_0$LOAD | Loads the first survivor metric of the new frame, which is used to compare with other survivors to determine the frame minimum metric. |
| RC 0-5 | Address lines from the read counter used for the encoder replica and the state metric RAMs. |
| CC 0-5 | Address lines from the column counter used to indicate the column address for the path memory. Incremented once every frame. |
| TC 0-5 | Address lines from the traceback counter. Downcounter decremented every time a new survivor is written in. |
| WC 0-5 | Address lines from the write counter (ROW) used to indicate the write address for the state and path memories. |
| CO$_{wc}$ | Carry out signal from the write counter used to identify the end of one frame. This is gated through appropriate logic to shut down the system and enable the sync section for the next I and Q coordinate. |
| $\overline{MTREN}$ | Metric Enable: used to force into registers A and B the first state metric and the first survivor designation for each group of four in the ACS section. |
| $\overline{WCEN}$ | Write Counter Enable: increments the write counter (ROW) after each survivor is determined. |
| PCLK | Path Clock: Shifts 2 bits of the path memory pointed to by the row address register into the row address register for the next traceback step. |
| $\overline{TCEN}$ | Trace Counter Enable: decrements the traceback counter for each survivor written in. |
| BC 0-1 | Branch Code: used as the path designation for each survivor in a group of four. These are the lowest order two bits of index r. |
| PTOG | Path Multiplexer Signal (path toggle): switches the column counter for writing or the traceback counter for reading out into the path memory address. |
| $\overline{WEA}/\overline{WEB}/\overline{WETR}$ | Write enables for the state metric RAMs and the path memory. |
| G$_{state\ metric}$ | Enable line for metric and path |

TABLE 2-continued
RATE-2/3 DECODER CONTROL SIGNALS

| | |
|---|---|
| | registers A and B in the ACS section. Same as $\overline{\text{MTREN}}$ during the forcing in of the first metric in a group of four, then becomes conditional depending on the values of the other three metrics in the group. |
| $CLR_{Rgc}$ | Clear Ring Counter. Clearing the ring counter disables the whole system. Occurs when the frame is over. |
| DLOAD | Data load: used to load the decoder data bits. |

We claim:

1. A Viterbi decoder for use in decoding a signal generated by an encoder processing as input a sequence of a plurality of possible encoder states and advancing through said sequence to produce in each of a plurality of decoding periods a transmitted signal dependent upon said sequence in accordance with a code, said decoder comprising:
   signal receiving means for quantizing for one of said decoding periods a received signal resultant from said transmitted signal;
   means for generating a plurality of replicas of transmitted signals that would lead to one of a plurality of new encoder states, each replica leading to said new encoder state via an associated branch;
   comparing means for measuring a difference between said quantized received signal and each of said replicas, said difference being a branch metric of the branch associated with said each replica;
   adding means for adding said branch metric to a state metric of a prior encoder state linked to said new encoder state by said associated branch;
   selecting means for selecting the branch to said new encoder state which has the minimum sum of said added branch metric and state metric, said minimum sum being the state metric of said new encoder state, whereby said selected branch and a path associated with the prior encoder state linked to said new encoder state by said selected branch defines the path associated with said new encoder state;
   means for sequentially generating said new encoder states, wherein said replica generating means, said comparing means and said selecting means complete their operation upon one said new encoder state between the times said state generating means generates said new encoder states in said one decoding period.

2. A Viterbi decoder as recited in claim 1, wherein said generating means sequentially generates said replicas.

3. A Viterbi decoder as recited in claim 1, wherein said selecting means comprises:
   a state metric memory for storing state metrics for all new encoder states.

4. A Viterbi decoder is recited in claim 1, further comprising:
   means for selecting the minimum of all state metrics of said new encoder states; and
   means for subtracting said selected minimum state metric from each of said state metrics of each said new encoder state to form an adjusted state metric.

5. A Viterbi decoder as recited in claim 3, wherein said comparing means comprises a memory containing differences addressed by said quantized received signal and said replica.

6. A Viterbi decoder as recited in claim 5, further comprising:
   a path memory for storing a designator for each selected branch; and
   means for tracing one of said paths in said path memory over a plurality of decoding periods.

7. A Viterbi decoder as recited in claim 6:
   further comprising means for selecting the minimum of all state metrics of said new encoder states; and
   wherein said tracing means traces said one path beginning at the designator to the selected branch linked to new encoder state having said selected minimum state metric.

8. A method for Viterbi decoding a signal generated by an encoder processing as input a sequence of a plurality of possible encoder states and advancing through said sequence to produce in each of a plurality of decoding periods a transmitted signal dependent upon said sequence in accordance with a code, said method comprising the steps of:
   measuring a received signal once per a decoding period;
   generating one of a plurality of encoder states;
   generating a plurality of replicas of a transmitted signal that would lead to said generated encoder state, each replica leading to said generated encoder state via an associated branch;
   measuring differences between said measured received signal and each of said replicas of each of said branches;
   adding said difference of each said branch to a state metric of an encoder state of a prior decoding period linked to said generated encoder state by said associated branch;
   selecting the branch to said generated encoder state having the minimum sum of said difference and state metric, said minimum sum being the state metric of said generated encoder state, whereby said selected branch and a path associated with the encoder state of said prior encoding period linked to said generated encoder state by said selected branch defines the path associated with said generated encoder state; and
   repeating said state generating, replica generating, distance measuring, adding and selecting steps for a plurality of said encoder states in said one decoding period.

9. A method of Viterbi decoding as recited in claim 8, further comprising the steps of:
   storing designators for all branches selected in a plurality of decoding periods in a memory; and
   tracing one said path in said memory for a plurality of decoding periods.

* * * * *